United States Patent [19]
Renz

[11] Patent Number: 5,895,984
[45] Date of Patent: Apr. 20, 1999

[54] CIRCUIT ARRANGEMENT FOR FEEDING A PULSE OUTPUT STAGE

[75] Inventor: Norbert Renz, Bregenz, Austria

[73] Assignee: Leica Geosystems AG, Heerbrugg, Switzerland

[21] Appl. No.: 08/894,103

[22] PCT Filed: Dec. 2, 1996

[86] PCT No.: PCT/EP96/05325

§ 371 Date: Aug. 13, 1997

§ 102(e) Date: Aug. 13, 1997

[87] PCT Pub. No.: WO97/22179

PCT Pub. Date: Jun. 19, 1997

[30] Foreign Application Priority Data

Dec. 13, 1995 [DE] Germany ............... 195 46 563

[51] Int. Cl.⁶ ......................................... H03K 3/00
[52] U.S. Cl. ............................... 307/106; 372/25
[58] Field of Search .................. 307/106; 327/124, 327/291, 544; 372/69, 82, 25, 38; 331/74, 75, 117 R, 117 FE, 167, 172–174

[56] References Cited

U.S. PATENT DOCUMENTS 3,628,048 12/1971 Lee et al. ........................ 372/38
3,898,588 8/1975 Skagerlund ..................... 331/112
5,736,881 4/1998 Ortiz ............................... 372/25

FOREIGN PATENT DOCUMENTS 23 31 084  1/1974  Germany .

OTHER PUBLICATIONS

B. Stadler, "Die Ladungstransformation, eine Methode zur Aufladung kapazitiver Speicher für Impulsanwendungen", *Archiv Bd.*, vol. 2, pp. 25–27.

Primary Examiner—Richard T. Elms
Attorney, Agent, or Firm—Foley & Lardner

[57] ABSTRACT

A circuit arrangement for feeding a pulse output stage is specified, which has at least one capacitor and, connected to the latter, a load, for example a diode laser. The capacitor is connected to a voltage source via a coil. The voltage of the voltage source is applied to the coil by means of a pulsed switching device. The energy stored in the coil is used to charge the capacitor. The latter is discharged by the same or a further switching device, generating a useful pulse through the load.

23 Claims, 4 Drawing Sheets

PWM coil current capacitor voltage useful pulse

PWM capacitor voltage useful pulse

CIRCUIT ARRANGEMENT FOR FEEDING A PULSE OUTPUT STAGE

FIELD OF THE INVENTION

The invention relates to a circuit arrangement for feeding a pulse output stage.

DESCRIPTION OF RELATED ART

A circuit arrangement of this type is disclosed in DE 23 31 084 C2. The inductor is designed as an isolating transformer, in which the primary winding of a transformer is connected to a low-voltage source via a pulse-controlled transistor switching device. The secondary winding is connected to the capacitor via a rectifier arrangement.

The pulse control device comprises an arrangement for specifying the transistor base voltage and a feedback circuit from the transformer to the base of the transistor. These form a free-running circuit in which the transistor is switched on periodically by control pulses during a specific time interval. The duration of the time interval can be adjusted by varying the turns ratio for the base voltage of the transistor or varying the source voltage. The duration determines the amount of energy which is stored in the transformer and can be transferred to the capacitor. The prevailing control instants of the transistor for the on and off states are determined exclusively by the primary-side oscillator components and the resonant circuit behavior in the secondary circuit.

In the off state of the transistor, the energy stored in the transformer is transferred via the secondary winding to the capacitor. The control pulse train of the transistor is also used to generate synchronous control pulses in the discharge path of the capacitor. The triggering of the useful pulses therefore also depends on the primaryside oscillator components.

A circuit arrangement for the inductive charging of a capacitive energy store is disclosed in B. Stadler, "Die Ladungstransformation . . . " [The charge transformation . . . ], etz-Archiv, Vol. 2 (1980), Issue 1, pp. 25 to 27. A voltage source which provides a high voltage directly charges a capacitor to the voltage of the voltage source via an inductor. By closing a switch, the capacitor is discharged in the form of a useful pulse, which is used for the pulsed excitation of a gas laser. The switch then opens automatically as a function of the discharge state of the capacitor. The amplitude of the discharge pulse is not adjustable. The charging cycle depends on the operating conditions.

Output stages of the type mentioned in the introduction supply voltage pulses having a low internal resistance and enable loads which are to be operated in a pulsed manner to be supplied with power. Such loads include pulsed diode lasers, inter alia. Pulse voltages of up to 100 volts are typically required here for diodes in the power range of a few tens of watts peak power. For larger pulse powers, far higher voltages will be necessary. Pulse repetition rates of several 10 kHz are customary here. Amplitude adjustment by changing the pulse voltage is additionally required.

For such output stages, use is frequently made of thyristors (cf. UNITRODE Inc., Design note 15) or MOS power transistors such as, for example, MOS field-effect transistors (MOS-FET) (cf. SILICONIX Inc., Application note "6.13.10 Laser Diode Pulsers"). Such a customarily used circuit arrangement is illustrated in FIGS. 7 and 8 using the example of a drive arrangement for a diode laser for the purposes of elucidation. A diode laser 2 as load, a capacitor 4 and a switching device in the form of a MOS-FET 1 (FIG. 7) or thyristor 6 (FIG. 8) are connected in series. The capacitor 4 is charged to a suitably high voltage by a charging circuit 3 (FIG. 7) or 5 (FIG. 8). The charging voltage is provided by a voltage source 7, which is connected to the capacitor 4, as is shown in FIGS. 7 and 8, by means of a transistor 8 (FIG. 7) or MOS-FET 15 (FIG. 8) as switching element via a resistor 9, which is in this case intended to encompass all of the lead impedances and internal resistances. In FIG. 8, a protective diode 11 is reverse-connected in parallel with the diode laser 2.

When the MOS-FET 1 or the thyristor 6 is driven, it connects the diode laser 2 to the charged capacitor 4. The latter is almost completely discharged by a current pulse flowing through the diode laser 2 and the MOS-FET 1 or thyristor 6. The capacitor 4 can be recharged in the pulse intervals of the drive pulses.

These circuit arrangements have the disadvantage that electrical energy corresponding to that supplied to the capacitor 4 is consumed in the resistor 9 of the voltage supply 3 or 5, and that the efficiency is consequently impaired. This is particularly disadvantageous when the high voltage must be generated from a voltage source with low voltage and a limited energy reserve, as occurs in small portable devices, with a finite efficiency. The outlay on materials and the costs of this high-voltage generation are likewise disadvantageous.

Amplitude adjustment can be carried out, even at high pulse repetition rates, by driving the switching element by a pulse-width-modulated signal, with the result that the capacitor 4 is charged to the corresponding final voltage by virtue of the different charging duration. This final voltage is not a linear function of the charging duration, but rather follows an exponential function. An additional increase in the high voltage and/or a constant-current source circuit would provide a remedial effect. However, the increased circuitry and the further impairment of the electrical efficiency, connected with additional costs, entail further disadvantages. The realization of the fast electronic switch for the high voltage, which switch likewise causes energy losses and costs, is also disadvantageous.

SUMMARY OF THE INVENTION

The invention was based on the object of being able to adjust the charging voltage of the capacitor for each useful pulse independently of the pulse repetition rate.

What the inventive circuit arrangement for feeding a pulse output stage makes it possible to do in an advantageous manner is to supply energy to a pulse output stage in the pulse intervals with high efficiency, particularly at low supply voltages. In this case, an additional DC voltage source for the high voltage is not necessary. Furthermore, the circuit arrangement according to the invention affords a simple option for being able to adjust the amplitude linearly, as a result of which it is also possible to perform rapid adjustment from pulse to pulse. The overall result is a reduction in materials and costs and an increase in the electrical efficiency.

The subject matter of the invention is described in more detail below in an exemplary manner using exemplary embodiments with reference to the drawings.

DETAILED DESCRIPTION OF THE PREFERRED EMBODIMENTS

Figure 1:
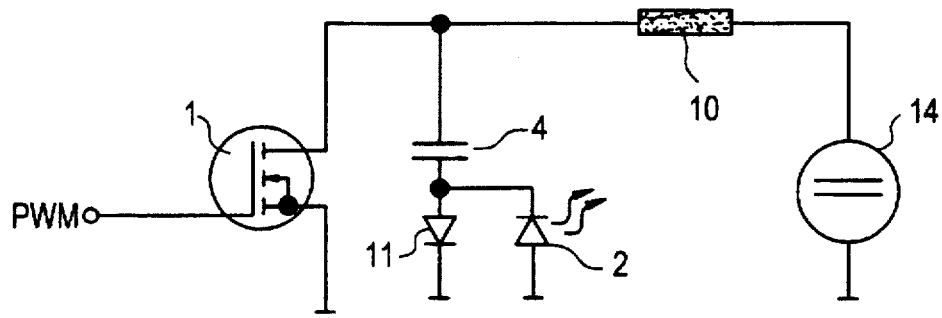
FIG. 1 shows a first embodiment of the invention.
Figure 2A:
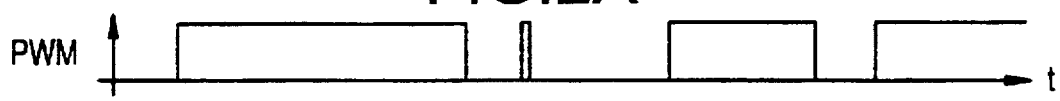
FIG. 2 shows timing diagrams of various pulse shapes of the first embodiment.
Figure 2B:
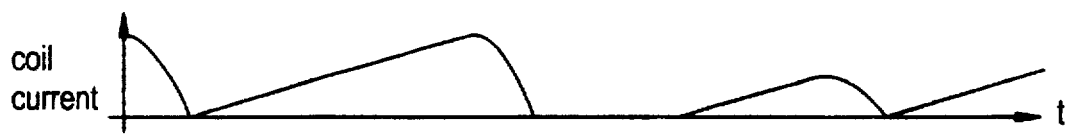
Figure 2C:
Figure 2D:

In the drawings, the same components in the different figures are designated by the same reference symbols.

Figure 8:
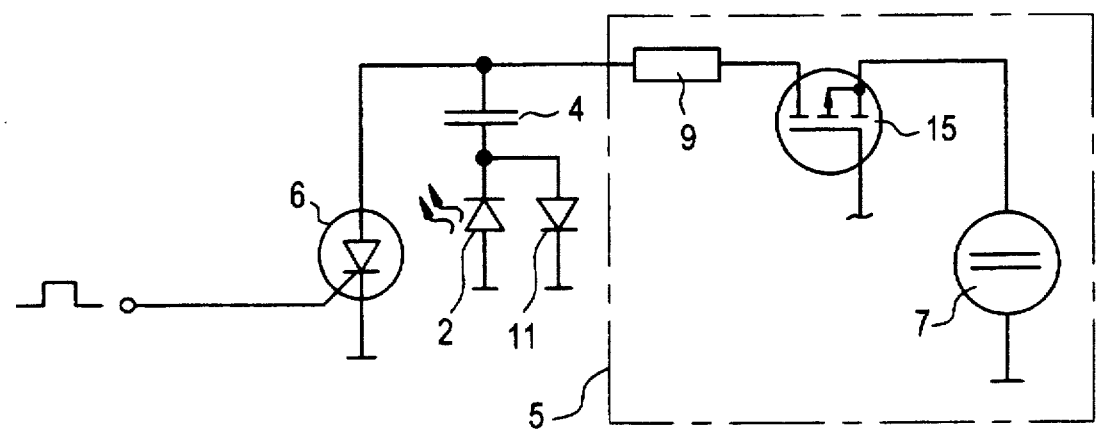

The method of operation of the first embodiment will be described first of all with reference to FIGS. 1 and 2, it being assumed that the components are ideal components. It is evident that the switchable output stage of FIG. 1 corresponds to that of FIG. 8 in accordance with the prior art, with the exception that a MOS-FET is used instead of the thyristor 6 as switching device 1.

What is fundamentally different is the voltage supply, which in this case comprises only a low-voltage source 14, a low voltage from the low-voltage source 14 (for example 6 volts of a battery) being applied directly to the pulse output stage, in other words without any appreciable losses, via a coil 10 having an inductance. The MOS-FET which is used as the switching device 1 can be driven by means of pulse-width-modulated pulses PWM. The MOS-FET is switched on in the pulse intervals, with the result that a linearly increasing flow of current can build up in the coil 10. In parallel with this, the capacitor 4, which has already been charged in a preceding cycle, is discharged in a pulsed manner in the form of the useful pulse via the diode laser used as output stage 2. The capacitor 4 and the coil 10 form a resonant circuit with the period T.

If the MOS-FET is switched off, then the voltage across the capacitor 4 rises sinusoidally and reaches its maximum after T/4, which maximum corresponds to the high voltage to be generated. The level of this voltage depends on the energy stored in the coil 10 and the ratio of the inductance of the coil to the capacitance of the capacitor 4. At the instant of this maximum, the MOS-FET should then be switched on again, in order to achieve the most favorable operating conditions, and the cycle can begin anew. The current at the instant of the turn-off of the MOS-FET is a linear function of the turned-on duration, and the maximum capacitor voltage is likewise strictly proportional to this current. Consequently, by means of a variable turned-on duration of the MOS-FET (which corresponds to pulse width modulation (PWM)), it is possible to perform, in a simple manner, high-voltage adjustment which reacts linearly for each individual pulse, independently of the pulse repetition rate.

In order to supplement FIG. 1, a number of signal profiles are represented in FIG. 2, (a) showing various pulse-width-modulated pulses, (b) showing the current flowing in each case through the coil 10, (c) showing the corresponding capacitor voltage and (d) showing the useful pulse. It is evident that when the MOS-FET is switched on, the voltage across the capacitor is at the reference potential, that is to say at ground in this case. The circuit arrangement according to FIG. 1 is distinguished by its simplicity. Since the components are not ideal in practice, losses occur, which are to be attributed mainly to the rectifying or protective diode arranged in the charging path 11 and to the on resistance of the MOS-FET and the quality factor of the resonance circuit. Efficiencies of more than 80% can be achieved without any difficulty, given sensible dimensioning. Modern components of very good quality, such as, for example, fast low-power MOS-FETs with ON resistances of less than 0.1 ohm, are now commercially available at very good value for money. The same applies correspondingly to the other components, too.

Figure 3:
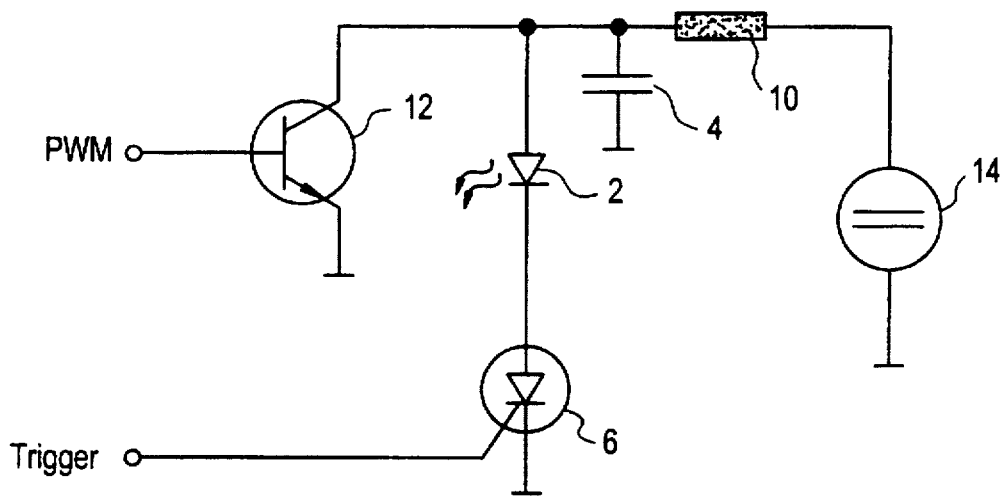
FIG. 3 shows a second embodiment of the invention.

In the embodiment shown in FIG. 3, the output stage 2 comprises a series circuit formed by a thyristor used as a triggerable switch 6 and a diode laser as load. The free connection of the diode laser is connected to a capacitor 4. The junction point between the diode laser and capacitor 4 is connected, on the one hand, to a coil 10 having an inductance and, on the other hand, to a transistor used as switching device 12, in such a way that said transistor is connected in parallel with the series circuit formed by the thyristor and diode laser. The free connection of the coil 10 is connected to a voltage source 14 for a supply voltage.

In the circuit arrangement of FIG. 3, the energy stored in the coil 10 is supplied, after the turn-off of the output stage, to the capacitor 4, as described above. This presupposes that the turn-off can be controlled by the control signal, something which is not ensured, for example, in the case of a thyristor output stage, since the thyristor at first switches off again when its holding current is undershot.

This problem is solved in this embodiment of the invention by using a further trigger signal in addition to the pulse-width-modulated signal PWM. The pulse-width-modulated signal PWM is in this case applied to the base of the transistor in order to apply the supply voltage of the voltage source 14 to the coil 10 when the transistor is switched on. The further trigger signal is applied as a trigger signal to the thyristor and is used only for the pulse triggering.

The circuit arrangement described above can be used in all output stages in which the combined function as shown in FIG. 1 is not suitable. In the case of the output stage with a thyristor, this additional transistor then also undertakes the turning off of the thyristor. The additional costs are negligible since this transistor may, as a rule, be an inexpensive type.

Figure 4A:
FIG. 4 shows timing diagrams of the various pulse shapes of the second embodiment.
Figure 4B:
Figure 4C:

In order to supplement FIG. 3, a number of signal profiles are represented in FIG. 4, (a) showing pulse-width-modulated pulses PWM, (b) showing the voltage across the capacitor 4 and (c) showing the trigger pulse. It is evident that when the transistor is switched on, the voltage across the capacitor 4 is at the reference potential, i.e. at ground in this case.

It emerges from the preceding functional descriptions that the useful pulse triggering should take place synchronously with the maximum of the capacitor voltage in order to obtain the best possible results. For various reasons the requirement for synchronism is disadvantageous, for example in the case where the possibility of frequency modulation during pulse generation is required, or where there is a requirement, due to problems in the temporal control sequence, for a phase shift during pulse generation with regard to the coil driving.

Figure 5:
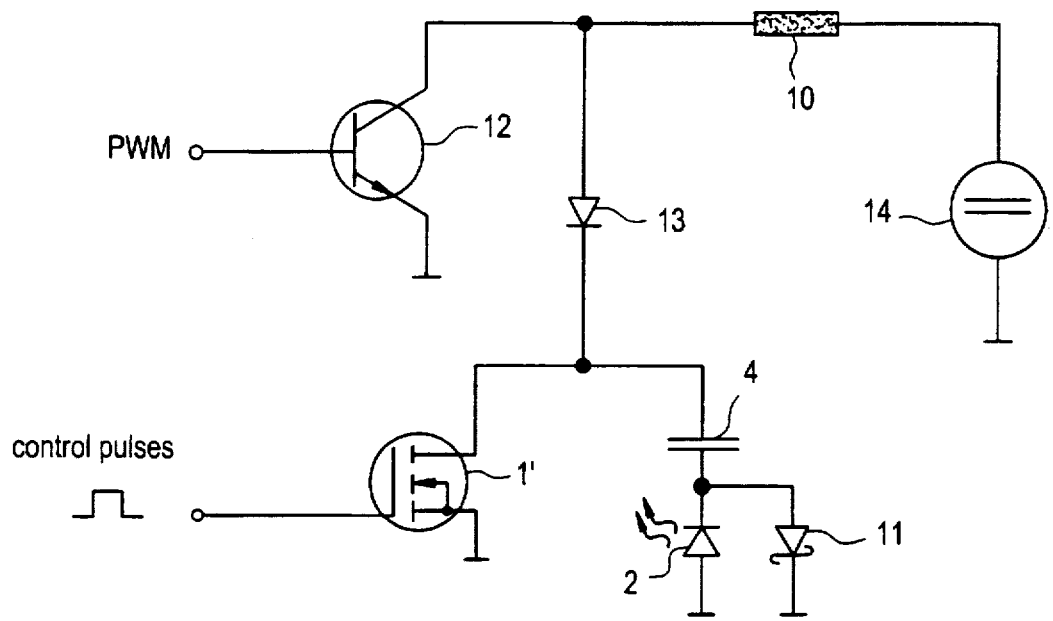
FIG. 5 shows a third embodiment of the invention.

Following the principle of using two signals in accordance with FIG. 3, it is possible, as is shown in FIG. 5, to modify the first embodiment in accordance with FIG. 1 in such a way that pulse generation can be triggered at any desired instant except when the energy is being supplied from the coil 10 to the capacitor 4.

In contrast to the embodiment of FIG. 1, the junction point between the capacitor 4 and a MOS-FET provided as second controllable switching device 1' is connected to the coil 10 via a diode 13 instead of directly. A transistor which is provided as switching device 12 and can be driven by pulse-width-modulated pulses (PWM) is connected in parallel with the pulse output stage. When the transistor is switched on, the supply voltage of the voltage source 14 is applied to the coil 10. Furthermore, in contrast to the embodiment of FIG. 1, the MOS-FET in this case serves exclusively to trigger a useful pulse, that is to say to discharge the capacitor 4 through the diode laser.

Pulse triggering by driving the MOS-FET can be executed at any desired instant, since the energy of the capacitor can no longer flow away through the diode 13. A large degree of freedom in the selection of the useful pulse position and the temporal coil driving is consequently obtained, independently of whether the pulse repetition rate is likewise varied as well. It is only necessary to ensure that there is a wait for the time T/4 of the resonant circuit. Only leakage losses lead to a discharge when the temporal pulse intervals become too long. However, the electrical efficiency is again slightly reduced by this additional diode 13.

Figure 6A:
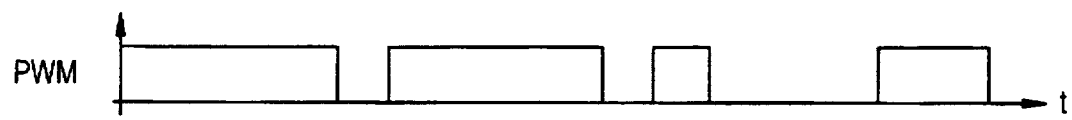
FIG. 6 shows timing diagrams of various pulse shapes of the third embodiment.
Figure 6B:
Figure 6C:
Figure 7:
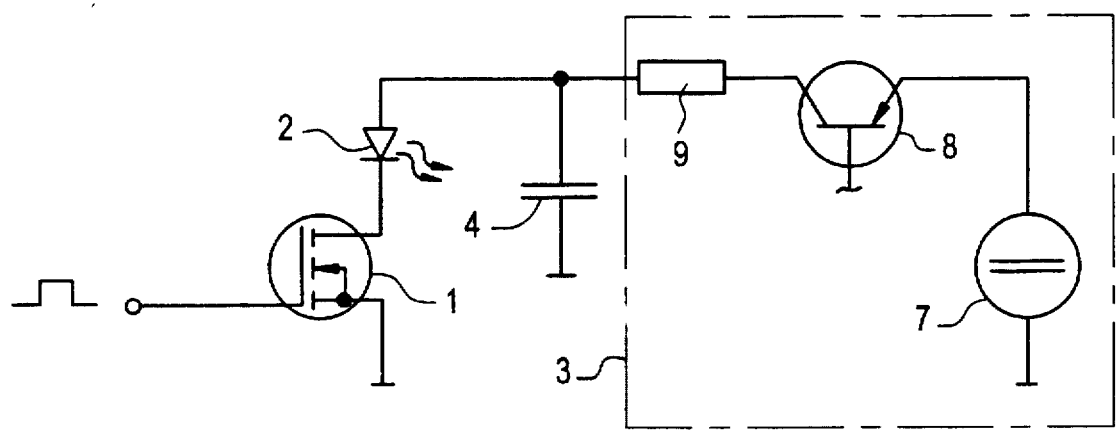
FIGS. 7 and 8 each show a circuit arrangement for the voltage supply of a pulse output stage according to the prior art.

In order to supplement FIG. 5, a number of signal profiles which are intended to demonstrate the high flexibility which is now available are represented in FIG. 6. (a) shows various pulse-width-modulated pulses (PWM), (b) shows the voltage across the capacitor 4 and (c) shows the useful pulses.

I claim:

1. Circuit arrangement for feeding a pulse output stage with pulses of constant polarity, in which an inductor can be connected to a low-voltage source by means of a controllable switching device, the current of the inductor flowing into a capacitor when the switching device is turned off, and the capacitor, after reaching its charge maximum, being connected to the output stage and being discharged in the form of a useful pulse, characterized in that the capacitor (4) is connected in series with the output stage (2) at the junction point between the inductor, which is designed as a coil (10), and the switching device (1), a charging path (11) for the capacitor (4) is connected in parallel with the output stage (2), the switching device (1) is driven with pulse width modulation (PWM), on the one hand, for the purpose of defining the charging voltage of the capacitor (4) and on the other hand, by being driven with a short pulse at the instant of maximum capacitor voltage, closes a discharge path for the capacitor (4), for the purpose of generating the useful pulse.

2. Circuit arrangement according to one of claim 1, characterized in that the output stage (2) is a diode laser.

3. Circuit arrangement according to claim 1, characterized in that the controllable switching device (1) is a MOS-FET.

4. Circuit arrangement according to claim 1, characterized in that the switching device (12) is a transistor.

5. Circuit arrangement for feeding a pulse output stage with pulses of constant polarity, in which an inductor can be connected to a low-voltage source by means of a controllable switching device, the current of the inductor flowing into a capacitor when the switching device is turned off, and the capacitor, after reaching its charge maximum, being connected to the output stage and being discharged in the form of a useful pulse, characterized in that the capacitor (4) and the output stage (2) are connected in parallel at the junction point between the inductor, which is designed as a coil (10), and the switching device (12), the switching device (12) is driven with pulse width modulation (PWM) for the purpose of defining the charging voltage of the capacitor (4), a triggerable switch (6), which is driven at the instant of the maximum charging voltage of the capacitor (4), is connected in series with the output stage (2).

6. Circuit arrangement according to claim 5, characterized in that the triggerable switch (6) is a thyristor.

7. Circuit arrangement according to claim 5, wherein the output stage (2) is a diode laser.

8. Circuit arrangement according to claim 5, wherein the switching device (12) is a transistor.

9. Circuit arrangement according to claim 5, wherein the switching device is a MOS-FET.

10. Circuit arrangement for feeding a pulse output stage with pulses of constant polarity, in which an inductor can be connected to a low-voltage source by means of a controllable switching device, the current of the inductor flowing into a capacitor when the switching device is turned off, and the capacitor, after reaching its charge maximum, being connected to the output stage and being discharged in the form of a useful pulse, characterized in that the capacitor (4) is connected in series with the output stage (2) and a diode (13) at the junction point between the inductor, which is designed as a coil (10), and the switching device (12), a charging path (11) for the capacitor (4) is connected in parallel with the output stage (2), the switching device (12) is driven with pulse width modulation (PWM) for the purpose of defining the charging voltage of the capacitor (4), and a second controllable switching device (1') is connected in parallel with the series circuit formed by the output stage (2) and the capacitor (4) and closes a discharge path for the capacitor (4), for the purpose of generating the useful pulse.

11. Circuit arrangement according to claim 10, wherein the output stage (2) is a diode laser.

12. Circuit arrangement according to claim 10, wherein the second controllable switching device (1') is a MOS-FET.

13. Circuit arrangement according to claim 10, wherein the switching device (12) is a transistor.

14. A circuit arrangement for feeding a pulse output stage with pulses of constant polarity, comprising:

a low-voltage source;

an inductor electrically connectable to the low-voltage source;

a switching device electrically connected to the inductor; and a capacitor electrically connected in series with the output stage at a junction point between the inductor and the switching device;

wherein current in the inductor flows into the capacitor when the switching device is in an off state;

wherein the capacitor is discharged through the output stage in the form of a pulse after reaching its charge maximum, and wherein a charge path for the capacitor is connected in parallel with the output stage.

15. The circuit arrangement of claim 14, wherein the switching device is driven with pulse width modulation to define a charging voltage of the capacitor, and wherein, at substantially the point of maximum capacitor voltage, the switching device is driven with a short pulse to close a discharge path for the capacitor to discharge through the pulse output stage, to generate the pulse.

16. The circuit arrangement of claim 15, wherein the output stage comprises a diode laser.

17. The circuit arrangement of claim 14, wherein the switching device is a transistor.

18. The circuit arrangement of claim 14, further comprising a second controllable switching device connected in parallel with a series circuit formed by the output stage and the capacitor, wherein the switching device is driven with a pulse width modulation to define a charging voltage of the capacitor, and wherein the second controllable switching device is configured to close a discharge path for the capacitor; and wherein the capacitor is connected in series with a diode at the junction between the inductor and the switching device.

19. The circuit arrangement of claim 18, wherein the output stage comprises a diode laser.

20. The circuit arrangement of claim 18, wherein the switching device is a transistor, and the second controllable switching device is a MOS-FET.

21. A circuit arrangement for feeding a pulse output stage with pulses of constant polarity, comprising:

a low-voltage source;

an inductor electrically connectable to the low-voltage source;

a controllable switching device electrically connected to the inductor;

a capacitor electrically connected in parallel with the output stage at a junction point between the inductor and the switching device; and a triggerable switch connected in series with the output stage;

wherein the capacitor is substantially discharged through the output stage in the form of a pulse after it reaches its charge maximum, wherein the switching device is driven with pulse width modulation to define a charging voltage of the capacitor, and wherein the triggerable switch is driven substantially when the capacitor reaches maximum charging voltage.

22. The circuit arrangement of claim 21, wherein the output stage comprises a diode laser.

23. The circuit arrangement of claim 21, wherein the triggerable switch is a thyristor.

* * * * *